(12) United States Patent
Tsukada et al.

(10) Patent No.: US 7,390,426 B2
(45) Date of Patent: Jun. 24, 2008

(54) PIEZOELECTRIC CERAMIC

(75) Inventors: Takeo Tsukada, Tokyo (JP); Tomohisa Azuma, Tokyo (JP); Masakazu Hirose, Tokyo (JP)

(73) Assignee: TDK Corporation, Tokyo (JP)

( * ) Notice: Subject to any disclaimer, the term of this patent is extended or adjusted under 35 U.S.C. 154(b) by 364 days.

(21) Appl. No.: 10/541,022

(22) PCT Filed: Mar. 19, 2004

(86) PCT No.: PCT/JP2004/003769

§ 371 (c)(1),
(2), (4) Date: Jun. 28, 2005

(87) PCT Pub. No.: WO2004/087611

PCT Pub. Date: Oct. 14, 2004

(65) Prior Publication Data

US 2006/0169946 A1    Aug. 3, 2006

(30) Foreign Application Priority Data

Mar. 28, 2003    (JP)    ............... 2003-089762

(51) Int. Cl.
   C04B 35/46    (2006.01)
   H01L 41/187    (2006.01)
(52) U.S. Cl. .................. 252/62.9 R; 501/134; 501/135; 501/136
(58) Field of Classification Search ............ 252/62.9 R; 501/134, 135, 136
   See application file for complete search history.

(56) References Cited

U.S. PATENT DOCUMENTS 6,241,908 B1 *    6/2001    Hirose et al. ............ 252/62.9 R
6,398,978 B1       6/2002    Hirose et al.
6,461,532 B1 *   10/2002    Oka et al. ............... 252/62.9 R
6,551,522 B2      4/2003    Hirose et al.

FOREIGN PATENT DOCUMENTS

| JP | 2000-143340 | 5/2000 |
|----|-------------|--------|
| JP | 2000-264727 | 9/2000 |
| JP | 2000-313662 | 11/2000 |
| JP | 2001-2468   | 1/2001 |
| JP | 2001-172078 | 6/2001 |
| JP | 2001-181030 | 7/2001 |
| JP | 2001-192267 | 7/2001 |
| JP | 2001-220226 | 8/2001 |
| JP | 2001-335362 | 12/2001 |
| JP | 2001-342061 | 12/2001 |
| JP | 2002-284574 | 10/2002 |
| JP | 2003-2741   | 1/2003 |
| JP | 2003-34574  | 2/2003 |

* cited by examiner

*Primary Examiner*—C. Melissa Koslow
(74) *Attorney, Agent, or Firm*—Oblon, Spivak, McClelland, Maier & Neustadt, P.C.

(57) ABSTRACT

The present invention has an object to provide piezoelectric ceramics containing no lead, having a high Curie point, and further, having excellent piezoelectric properties, particularly large Qmax. The piezoelectric ceramics contain, as a main component, a bismuth layer-structured compound having $(M^{II}_{1-x}Ln_x)Bi_4Ti_4O_{15}$ crystals ($M^{II}$ is an element selected from Sr, Ba, and Ca, Ln is an element selected from lanthanoids, and x is within a range of $0<x\leqq0.5$) and further contain, as secondary components, at least one of Mn oxide and Co oxide, and lanthanoid, wherein the lanthanoid being the secondary component is contained within a range of 0.02 to 0.12 wt % in terms of oxide thereof.

9 Claims, No Drawings

PIEZOELECTRIC CERAMIC

TECHNICAL FIELD

The present invention relates to piezoelectric ceramics and, in particular, relates to piezoelectric ceramics that can be used in fields of resonators, high temperature sensors, and so on by utilizing thickness longitudinal vibration of a bismuth layer-structured compound.

BACKGROUND ART

Piezoelectric ceramics have been widely used not only in a field of electronic devices such as resonators and filters, but also in products and the like such as sensors and actuators that use electric charge and displacement.

The conventional piezoelectric ceramics are generally ferroelectrics having a perovskite structure, such as lead titanate zirconate of the tetragonal system or trigonal system ($PbZrO_3$-$PbTiO_3$ solid solution, hereinafter referred to as PZT), or lead titanate of the tetragonal system ($PbTiO_3$, hereinafter referred to as PT). By adding secondary components to these materials, there have been obtained ones having various piezoelectric properties.

However, many of these PZT-based or PT-based piezoelectric ceramics have Curie points of about 200 to 400° C. and thus become paraelectrics at higher temperatures to lose the piezoelectric properties thereof so that they can not be applied to usage at high temperatures, for example, nuclear reactor control sensors and the like. Further, the foregoing PZT-based or PT-based piezoceramics contain about 60 to 70 wt % lead oxide (PbO) and therefore are not preferable also in terms of ecology and prevention of environmental pollution.

In order to meet such a demand, there is disclosed, as piezoelectric ceramics having a high Curie point and containing no lead oxide at all, for example, a piezoelectric ceramic element using a piezoelectric ceramic composition containing $SrBi_4Ti_4O_{15}$ as a main component and further containing at least one of Sc and Y in a range of 0.1 mol or less relative to 1 mol Bi in the main component (Unexamined Patent Publication No. 2001-172078).

Further, there are disclosed piezoelectric ceramics composed of a bismuth layer-structured compound containing $(Sr_xLn_{1-x})Bi_4Ti_4O_{15}$ crystals (Unexamined Patent Publication No. 2000-143340), and piezoelectric ceramics composed of a bismuth layer-structured compound containing $M''Bi_4Ti_4O_{15}$ crystals ($M''$ is an element selected from Sr, Ba, and Ca) (Unexamined Patent Publication No. 2001-192267).

Here, in case of a resonator, since it is used as an inductor, there are required piezoelectric ceramics in which Qm (mechanical quality factor), one of important properties in the piezoelectric properties, or Qmax (maximum value of Q=tan θ, θ:phase) between a resonant frequency and an antiresonant frequency, is large.

However, with respect to the piezoelectric ceramic element disclosed in Unexamined Patent Publication No. 2001-172078, there has been a problem that although an electromechanical coupling coefficient kt and a resonant frequency temperature change rate frTC from −20° C. to 80° C. are improved, the foregoing Qmax is insufficient and therefore it does not have the sufficient piezoelectric properties applicable to the resonator.

On the other hand, the piezoelectric ceramics disclosed in Unexamined Patent Publication No. 2000-143340 or Unexamined Patent Publication No. 2001-192267 have large Qmax, but demands have been made for ones having larger Qmax as piezoelectric ceramics using thickness longitudinal vibration.

DISCLOSURE OF THE INVENTION

Therefore, the present invention has been made in view of the foregoing circumstances and provides piezoelectric ceramics containing no lead, having a high Curie point, and further, having excellent piezoelectric properties, particularly large Qmax.

For accomplishing such an object, the present invention is configured to contain, as a main component, a bismuth layer-structured compound having $(M''_{1-x}Ln_x)Bi_4Ti_4O_{15}$ crystals ($M''$ is an element selected from Sr, Ba, and Ca, Ln is an element selected from lanthanoids, and x is within a range of $0<x\leq0.5$) and further contain, as secondary components, at least one of Mn oxide and Co oxide, and lanthanoid, wherein the content of the lanthanoid being the secondary component falls within a range of 0.02 to 0.12 wt % in terms of oxide thereof.

As a preferred mode of the present invention, it is configured such that the content of said Mn oxide or Co oxide falls within a range of 0.02 to 0.62 wt % in terms of MnO or CoO.

As a preferred mode of the present invention, it is configured such that lanthanoid selected as Ln is any one of La, Pr, Sm, Gd, Dy, and Ho.

As a preferred mode of the present invention, it is configured such that the lanthanoid being the secondary component is any one of Pr, Nd, Sm, Gd, Dy, and Ho.

According to the present invention as described above, there are enabled piezoelectric ceramics excellent in piezoelectric properties such that no lead is contained, a Curie point is high, i.e. 450° C. or more, and further, by suitably selecting $M''$, Qmax becomes 12 or more at 16 MHz being a lower limit of harmonic vibration (third order vibration) utilizing thickness longitudinal vibration, or large Qmax of 6 or more is achieved at 60 MHz being an upper limit of the harmonic vibration (third order vibration). The achievement of large Qmax enables reduction in size of a resonator, a high temperature sensor, and the like.

BEST MODE FOR CARRYING OUT THE INVENTION

Hereinbelow, an embodiment of the present invention will be described.

Piezoelectric ceramics of the present invention are piezoelectric ceramics that contain as a main component a bismuth layer-structured compound having $(M''_{1-x}Ln_x)Bi_4Ti_4O_{15}$ crystals and further contain, as secondary components, lanthanoid and at least one of Mn oxide and Co oxide, and are used in thickness longitudinal vibration.

The foregoing $M''$ is an element selected from Sr, Ba, and Ca, Ln is an element selected from lanthanoids, and x is set within a range of $0<x\leq0.5$, preferably $0.01\leq x\leq0.2$.

$M''$ can be suitably selected depending on a vibration range, to be used, of the piezoelectric ceramics, for example, the lower limit side (16 to 33 MHz) or the upper limit side (33 to 60 MHz) of the harmonic vibration (third order vibration).

Lanthanoid selected as Ln is La, Ce, Pr, Nd, Pm, Sm, Eu, Gd, Tb, Dy, Ho, Er, Tm, Yb, or Lu. Among them, particularly La, Pr, Sm, Gd, Dy, or Ho is preferable. It is considered that such Ln substitutes $M''$ sites of $M''Bi_4Ti_4O_{15}$ crystals. If Ln does not substitute the $M''$ sites in the foregoing range (when x=0), there is obtained no effect to improve Qmax (maximum value of Q=tan θ, θ:phase) between a resonant frequency and an antiresonant frequency. On the other hand, if the content of Ln substituting the $M^{II}$ sites exceeds 50 mol % (when x>0.5), Qmax becomes low, which is not preferable.

Lanthanoid contained as the secondary component is contained in the piezoelectric ceramics within a range of 0.02 to 0.12 wt %, preferably 0.05 to 0.1 wt % in terms of oxide thereof. It is considered that such lanthanoid as the secondary component exists at grain boundaries of the $(M^{II}_{1-x}Ln_x)Bi_4Ti_4O_{15}$ crystals. If the content of this lanthanoid is less than 0.02 wt %, Qmax becomes low and the density becomes insufficient, which is not preferable. On the other hand, if the content exceeds 0.12 wt %, there is obtained no effect to improve Qmax. Lanthanoid as the secondary component is La, Ce, Pr, Nd, Pm, Sm, Eu, Gd, Tb, Dy, Ho, Er, Tm, Yb, or Lu. Among them, particularly Pr, Nd, Sm, Gd, Dy, or Ho is preferable.

The content of at least one of Mn oxide and Co oxide contained as the secondary component falls within a range of 0.02 to 0.62 wt %, preferably 0.03 to 0.43 wt % in terms of MnO or CoO. If the content of one of Mn oxide and Co oxide or the total content of the two is less than 0.02 wt %, there is obtained no effect to improve Qmax, while, if it exceeds 0.62 wt %, polarization becomes difficult, which is not preferable.

Incidentally, the piezoelectric ceramics of the present invention may contain Mn, Ba, Ca, Zr, Sn, Mo, W, Y, Zn, Sb, Si, Nb, Ta, or the like as an impurity or a minor additive. In this event, the content thereof is preferably 0.01 wt % or less of the whole in terms of oxide thereof.

With respect to the $(M^{II}_{1-x}Ln_x)Bi_4Ti_4O_{15}$ crystals being the main component of the piezoelectric ceramics of the present invention, for example, the ratio of $M^{II}$, Ln, or Bi relative to Ti may tolerably deviate from a stoichiometric composition in a range of about ±5% or less.

A crystal grain of the piezoelectric ceramics of the present invention is spindle-shaped or needle-shaped, and its average grain size is not particularly limited and is, for example, 1 to 10 μm, preferably about 3 to 5 μm in a major axis direction thereof.

The piezoelectric ceramics of the present invention as described above have a high Curie point of 450° C. or more and are further such that, by suitably selecting $M^{II}$, Qmax becomes 12 or more at 16 MHz being a lower limit of harmonic vibration (third order vibration) utilizing thickness longitudinal vibration, or large Qmax of 6 or more is achieved at 60 MHz being an upper limit of the harmonic vibration (third order vibration). Therefore, they are applicable to a resonator, a high temperature sensor, and the like. Further, since no lead is contained, they are safe enough also in terms of preservation of the environment. Moreover, size reduction in the resonator, the high temperature sensor, and the like is enabled.

Next, description will be given about one example of production of the piezoelectric ceramics of the present invention.

First, substances to become a main component $[(M^{II}_{1-x}Ln_x)Bi_4Ti_4O_{15}]$ and at least one of Mn oxide and Co oxide being a secondary component are weighed as starting substances and wet mixed by the use of a ball mill or the like. Specifically, powder raw materials of compounds that can be changed to oxides by sintering, for example, carbonate, hydroxide, oxalate, nitrate, and the like, concretely $M^{II}CO_3$ ($M^{II}$ is an element selected from Sr, Ba, and Ca), $Ln_2O_3$ (Ln is lanthanoid), $Bi_2O_3$, $TiO_2$, MnO, CoO, $MnCO_3$, and the like, are weighed so that the main component $[(M^{II}_{1-x}Ln_x)Bi_4Ti_4O_{15}]$ has a desired composition, and are wet mixed by the use of the ball mill or the like.

This mixture is dried and is then subjected to calcination at 700 to 1000° C., preferably about 750 to 850° C. for about 1 to 3 hours. The obtained calcined thing is added with lanthanoid as a secondary component, for example, a compound composed of $Ln_2O_3$ (Ln is lanthanoid), and formed into a slurry which is then wet milled by the use of the ball mill or the like. Subsequently, the calcined thing is dried and is then granulated by adding a binder such as polyvinyl alcohol (PVA) depending on necessity. Thereafter, this granulated powder is subjected to press molding (pressure 100 to 400 MPa) to obtain a compact. As described above, since lanthanoid as the secondary component is added after the calcination, it is considered that lanthanoid as the secondary component exists at grain boundaries of the $(M^{II}_{1-x}Ln_x)Bi_4Ti_4O_{15}$ crystals.

Then, the foregoing compact is subjected to sintering at about 1100 to 1250° C. for 1 to 5 hours, and a polarization process (a polarization electric field is 1.1 times or more a coercive electric field) is applied to this sintered compact in a silicon oil bath at 150 to 250° C. to obtain piezoelectric ceramics. The sintering may be carried out in the atmosphere. Alternatively, it may be carried out in an atmosphere with an oxygen partial pressure lower or higher the atmosphere, or in a pure oxygen atmosphere. When the binder such as PVA is used, it is preferable to perform a heat treatment before the sintering to thereby volatilize the binder.

Next, the present invention will be described in further detail by examples, but the present invention is not limited by these examples in any aspect.

EXAMPLE 1

Respective powder raw materials of $SrCO_3$, $La_2O_3$, $Bi_2O_3$, $TiO_2$, $MnCO_3$, and $Pr_2O_3$ were prepared as starting substances and weighed so that a final composition of a main component should be $(Sr_{0.95}La_{0.05})Bi_4Ti_4O_{15}$ and the content of $MnCO_3$ being a secondary component should be 0.3 wt % in terms of MnO, and were then subjected to ball mill mixing (about 16 hours) in pure water by the use of zirconia balls.

The obtained mixture was fully dried, and was then subjected to temporary molding and further subjected to calcination in the air for 2 hours. The calcination temperature was selected from a range of 800 to 1000° C. Thereafter, $Pr_2O_3$ was weighed and added to the obtained calcined things so that the contents thereof should be as shown in Table 1 below. Then, wet milling and mixing of the additive ($Pr_2O_3$) were carried out by the use of the foregoing ball mill. Subsequently, after drying, 6 wt % pure water was added as a binder and press molding was performed, thereby obtaining six kinds of temporary compacts each having a length of 40 mm, a width of 40 mm, and a thickness of about 13 mm. These temporary compacts were subjected to vacuum packing and then subjected to isostatic molding under a pressure of 245 MPa.

Then, the foregoing compacts were subjected to sintering (in the atmosphere) at about 1120 to 1235° C. for 4 hours to thereby obtain sintered compacts. Subsequently, a plate-like member having a length of 30 mm, a width of 30 mm, and a thickness of 0.55 mm was cut out from each of the sintered compacts and was subjected to lap polishing to thereby obtain a thin plate having a thickness of 435 μm. Thereafter, Cu electrodes were formed on both surfaces of each thin plate by vacuum deposition.

Then, a polarization process was carried out such that an electric field of 1.5×Ec (MV/m) or more was applied in a silicon oil bath at 250° C. for 1 minute so as to have a thickness direction of each thin plate coincide with a polarization direction. Herein, Ec represents a coercive electric field of each sintered compact at 250° C.

Each of the sintered compacts thus polarized was subjected to etching to remove the Cu electrodes by the use of a ferric chloride solution and was then cut into a size of 7 mm long and 4.5 mm wide, thereby obtaining piezoelectric ceramics (Sample 1-1 to Sample 1-6). On both surfaces of each of the piezoelectric ceramics, Ag electrodes (diameter 1.5 mm, thickness 1 μm) for evaluating thickness longitudinal vibration were formed by the vacuum deposition method.

With respect to each of the piezoelectric ceramics thus produced, Qmax was measured under the following condition and a result thereof was shown in Table 1 below.

Measurement Condition of Qmax

By the use of an impedance analyzer HP4194A produced by Hewlett-Packard Development Company, L.P., the impedance characteristic was measured in a three-order harmonic mode of thickness longitudinal vibration (16 MHz) to derive Qmax. Qmax contributes to low-voltage oscillation as a resonator and Qmax at 16 MHz is required to be 12 or more.

TABLE 1

| Piezoelectric Ceramics | Pr Content (wt %) | Qmax (16 MHz) |
| --- | --- | --- |
| *Sample 1-1 | 0 | 11.6 |
| Sample 1-2 | 0.02 | 12.3 |
| Sample 1-3 | 0.05 | 12.6 |
| Sample 1-4 | 0.10 | 12.5 |
| Sample 1-5 | 0.12 | 12.0 |
| *Sample 1-6 | 0.14 | 10.3 |

Sample with * mark deviates from the present invention.

As shown in Table 1, it was confirmed that the piezoelectric ceramics (Sample 1-2 to Sample 1-5) containing $(Sr_{0.95}La_{0.05})Bi_4Ti_4O_{15}$ being the main component, and Mn oxide and Pr oxide as the secondary components, and further, containing the Pr oxide in a range of 0.02 to 0.12 wt % in terms of $Pr_2O_3$, all had Qmax of 12 or more. Further, Curie points of these piezoelectric ceramics (measured by the use of LCR meter HP4394A produced by Hewlett-Packard Development Company, L.P. and an electric furnace) were all 530° C. or higher.

EXAMPLE 2

First, respective powder raw materials of $SrCO_3$, $La_2O_3$, $Bi_2O_3$, $TiO_2$, $MnCO_3$, and $Pr_2O_3$ were prepared as starting substances and weighed so that a final composition of a main component should be $(Sr_{0.9}La_{0.1})Bi_4Ti_4O_{15}$ and the content of $MnCO_3$ being a secondary component should be 0.24 wt % in terms of MnO, and were then subjected to ball mill mixing (about 16 hours) in pure water by the use of zirconia balls.

Thereafter, the obtained mixture was used to obtain piezoelectric ceramics (Sample 2-1 to Sample 2-6) like in Example 1. However, $Pr_2O_3$ was weighed and added to calcined things so that the contents thereof should be as shown in Table 2 below. On both surfaces of each of the piezoelectric ceramics, Ag electrodes (diameter 1.5 mm, thickness 1 μm) for evaluating thickness longitudinal vibration were formed by the vacuum deposition method.

With respect to each of the piezoelectric ceramics thus produced, Qmax was measured under the same condition as in Example 1, and a result thereof was shown in Table 2 below.

TABLE 2

| Piezoelectric Ceramics | Pr Content (wt %) | Qmax (16 MHz) |
| --- | --- | --- |
| *Sample 2-1 | 0 | 11.8 |
| Sample 2-2 | 0.02 | 13.0 |
| Sample 2-3 | 0.05 | 13.4 |
| Sample 2-4 | 0.10 | 12.9 |
| Sample 2-5 | 0.12 | 12.0 |
| *Sample 2-6 | 0.14 | 7.2 |

Sample with * mark deviates from the present invention.

As shown in Table 2, it was confirmed that the piezoelectric ceramics (Sample 2-2 to Sample 2-5) containing $(Sr_{0.9}La_{0.1})Bi_4Ti_4O_{15}$ being the main component, and Mn oxide and Pr oxide as the secondary components, and further, containing the Pr oxide in a range of 0.02 to 0.12 wt % in terms of $Pr_2O_3$, all had Qmax of 12 or more. Further, Curie points of these piezoelectric ceramics were measured like in Example 1 and consequently were all 510° C. or higher.

EXAMPLE 3

First, respective powder raw materials of $SrCO_3$, $La_2O_3$, $Bi_2O_3$, $TiO_2$, $MnCO_3$, and $Sm_2O_3$ were prepared as starting substances and weighed so that a final composition of a main component should be $(Sr_{0.9}La_{0.1})Bi_4Ti_4O_{15}$ and the content of $MnCO_3$ being a secondary component should be 0.3 wt % in terms of MnO, and were then subjected to ball mill mixing (about 16 hours) in pure water by the use of zirconia balls.

Thereafter, the obtained mixture was used to obtain piezoelectric ceramics (Sample 3-1 to Sample 3-6) like in Example 1. However, $Sm_2O_3$ was weighed and added to calcined things so that the contents thereof should be as shown in Table 3 below. On both surfaces of each of the piezoelectric ceramics, Ag electrodes (diameter 1.5 mm, thickness 1 μm) for evaluating thickness longitudinal vibration were formed by the vacuum deposition method.

With respect to each of the piezoelectric ceramics thus produced, Qmax was measured under the same condition as in Example 1, and a result thereof was shown in Table 3 below.

TABLE 3

| Piezoelectric Ceramics | Sm Content (wt %) | Qmax (16 MHz) |
| --- | --- | --- |
| *Sample 3-1 | 0 | 11.8 |
| Sample 3-2 | 0.02 | 12.2 |
| Sample 3-3 | 0.05 | 12.3 |
| Sample 3-4 | 0.10 | 12.2 |
| Sample 3-5 | 0.12 | 12.0 |
| *Sample 3-6 | 0.14 | 10.6 |

Sample with * mark deviates from the present invention.

As shown in Table 3, it was confirmed that the piezoelectric ceramics (Sample 3-2 to Sample 3-5) containing $(Sr_{0.9}La_{0.1})Bi_4Ti_4O_{15}$ being the main component, and Mn oxide and Sm oxide as the secondary components, and further, containing the Sm oxide in a range of 0.02 to 0.12 wt % in terms of $Sm_2O_3$, all had Qmax of 12 or more. Further, Curie points of these piezoelectric ceramics were measured like in Example 1 and consequently were all 510° C. or higher.

EXAMPLE 4

First, respective powder raw materials of $SrCO_3$, $La_2O_3$, $Bi_2O_3$, $TiO_2$, $MnCO_3$, and $Nd_2O_3$ were prepared as starting substances and weighed so that a final composition of a main component should be $(Sr_{0.8}La_{0.2})Bi_4Ti_4O_{15}$ and the content of $MnCO_3$ being a secondary component should be 0.18 wt % in terms of MnO, and were then subjected to ball mill mixing (about 16 hours) in pure water by the use of zirconia balls.

Thereafter, the obtained mixture was used to obtain piezoelectric ceramics (Sample 4-1 to Sample 4-6) like in Example 1. However, $Nd_2O_3$ was weighed and added to calcined things so that the contents thereof should be as shown in Table 4 below. On both surfaces of each of the piezoelectric ceramics, Ag electrodes (diameter 1.5 mm, thickness 1 μm) for evaluating thickness longitudinal vibration were formed by the vacuum deposition method.

With respect to each of the piezoelectric ceramics thus produced, Qmax was measured under the same condition as in Example 1, and a result thereof was shown in Table 4 below.

TABLE 4

| Piezoelectric Ceramics | Nd Content (wt %) | Qmax (16 MHz) |
|---|---|---|
| *Sample 4-1 | 0 | 11.6 |
| Sample 4-2 | 0.02 | 12.5 |
| Sample 4-3 | 0.05 | 12.9 |
| Sample 4-4 | 0.10 | 12.6 |
| Sample 4-5 | 0.12 | 12.3 |
| *Sample 4-6 | 0.14 | 8.3 |

Sample with * mark deviates from the present invention.

As shown in Table 4, it was confirmed that the piezoelectric ceramics (Sample 4-2 to Sample 4-5) containing $(Sr_{0.8}La_{0.2})Bi_4Ti_4O_{15}$ being the main component, and Mn oxide and Nd oxide as the secondary components, and further, containing the Nd oxide in a range of 0.02 to 0.12 wt % in terms of $Nd_2O_3$, all had Qmax of 12 or more. Further, Curie points of these piezoelectric ceramics were measured like in Example 1 and consequently were all 490° C. or higher.

EXAMPLE 5

First, respective powder raw materials of $SrCO_3$, $La_2O_3$, $Bi_2O_3$, $TiO_2$, $MnCO_3$, and $Gd_2O_3$ were prepared as starting substances and weighed so that a final composition of a main component should be $(Sr_{0.7}La_{0.3})Bi_4Ti_4O_{15}$ and the content of $MnCO_3$ being a secondary component should be 0.24 wt % in terms of MnO, and were then subjected to ball mill mixing (about 16 hours) in pure water by the use of zirconia balls.

Thereafter, the obtained mixture was used to obtain piezoelectric ceramics (Sample 5-1 to Sample 5-6) like in Example 1. However, $Gd_2O_3$ was weighed and added to calcined things so that the contents thereof should be as shown in Table 5 below. On both surfaces of each of the piezoelectric ceramics, Ag electrodes (diameter 1.5 mm, thickness 1 μm) for evaluating thickness longitudinal vibration were formed by the vacuum deposition method.

With respect to each of the piezoelectric ceramics thus produced, Qmax was measured under the same condition as in Example 1, and a result thereof was shown in Table 5 below.

TABLE 5

| Piezoelectric Ceramics | Gd Content (wt %) | Qmax (16 MHz) |
|---|---|---|
| *Sample 5-1 | 0 | 11.4 |
| Sample 5-2 | 0.02 | 12.1 |
| Sample 5-3 | 0.05 | 12.2 |
| Sample 5-4 | 0.10 | 12.5 |
| Sample 5-5 | 0.12 | 12.4 |
| *Sample 5-6 | 0.14 | 11.7 |

Sample with * mark deviates from the present invention.

As shown in Table 5, it was confirmed that the piezoelectric ceramics (Sample 5-2 to Sample 5-5) containing $(Sr_{0.7}La_{0.3})Bi_4Ti_4O_{15}$ being the main component, and Mn oxide and Gd oxide as the secondary components, and further, containing the Gd oxide in a range of 0.02 to 0.12 wt % in terms of $Gd_2O_3$, all had Qmax of 12 or more. Further, Curie points of these piezoelectric ceramics were measured like in Example 1 and consequently were all 460° C. or higher.

EXAMPLE 6

First, respective powder raw materials of $SrCO_3$, $La_2O_3$, $Bi_2O_3$, $TiO_2$, $MnCO_3$, and $Ho_2O_3$ were prepared as starting substances and weighed so that a final composition of a main component should be $(Sr_{0.6}La_{0.4})Bi_4Ti_4O_{15}$ and the content of $MnCO_3$ being a secondary component should be 0.24 wt % in terms of MnO, and were then subjected to ball mill mixing (about 16 hours) in pure water by the use of zirconia balls.

Thereafter, the obtained mixture was used to obtain piezoelectric ceramics (Sample 6-1 to Sample 6-6) like in Example 1. However, $Ho_2O_3$ was weighed and added to calcined things so that the contents thereof should be as shown in Table 6 below. On both surfaces of each of the piezoelectric ceramics, Ag electrodes (diameter 1.5 mm, thickness 1 μm) for evaluating thickness longitudinal vibration were formed by the vacuum deposition method.

With respect to each of the piezoelectric ceramics thus produced, Qmax was measured under the same condition as in Example 1, and a result thereof was shown in Table 6 below.

TABLE 6

| Piezoelectric Ceramics | Ho Content (wt %) | Qmax (16 MHz) |
|---|---|---|
| *Sample 6-1 | 0 | 11.2 |
| Sample 6-2 | 0.02 | 12.2 |
| Sample 6-3 | 0.05 | 12.6 |
| Sample 6-4 | 0.10 | 12.5 |
| Sample 6-5 | 0.12 | 12.0 |
| *Sample 6-6 | 0.14 | 9.5 |

Sample with * mark deviates from the present invention.

As shown in Table 6, it was confirmed that the piezoelectric ceramics (Sample 6-2 to Sample 6-5) containing $(Sr_{0.6}La_{0.4})Bi_4Ti_4O_{15}$ being the main component, and Mn oxide and Ho oxide as the secondary components, and further, containing the Ho oxide in a range of 0.02 to 0.12 wt % in terms of $Ho_2O_3$, all had Qmax of 12 or more. Further, Curie points of these piezoelectric ceramics were measured like in Example 1 and consequently were all 450° C. or higher.

EXAMPLE 7

First, respective powder raw materials of $SrCO_3$, $La_2O_3$, $Bi_2O_3$, $TiO_2$, $MnCO_3$, and $Dy_2O_3$ were prepared as starting substances and weighed so that a final composition of a main component should be $(Sr_{0.8}La_{0.2})Bi_4Ti_4O_{15}$ and the content of $MnCO_3$ being a secondary component should be 0.12 wt % in terms of MnO, and were then subjected to ball mill mixing (about 16 hours) in pure water by the use of zirconia balls.

Thereafter, the obtained mixture was used to obtain piezoelectric ceramics (Sample 7-1 to Sample 7-6) like in Example 1. However, $Dy_2O_3$ was weighed and added to calcined things so that the contents thereof should be as shown in Table 7 below. On both surfaces of each of the piezoelectric ceramics, Ag electrodes (diameter 1.5 mm, thickness 1 μm) for evaluating thickness longitudinal vibration were formed by the vacuum deposition method.

With respect to each of the piezoelectric ceramics thus produced, Qmax was measured under the same condition as in Example 1, and a result thereof was shown in Table 7 below.

TABLE 7

| Piezoelectric Ceramics | Dy Content (wt %) | Qmax (16 MHz) |
|---|---|---|
| *Sample 7-1 | 0 | 11.6 |
| Sample 7-2 | 0.02 | 12.6 |
| Sample 7-3 | 0.05 | 13.0 |
| Sample 7-4 | 0.10 | 12.9 |
| Sample 7-5 | 0.12 | 12.3 |
| *Sample 7-6 | 0.14 | 9.5 |

Sample with * mark deviates from the present invention.

As shown in Table 7, it was confirmed that the piezoelectric ceramics (Sample 7-2 to Sample 7-5) containing $(Sr_{0.8}La_{0.2})Bi_4Ti_4O_{15}$ being the main component, and Mn oxide and Dy oxide as the secondary components, and further, containing the Dy oxide in a range of 0.02 to 0.12 wt % in terms of $Dy_2O_3$, all had Qmax of 12 or more. Further, Curie points of these piezoelectric ceramics were measured like in Example 1 and consequently were all 490° C. or higher.

EXAMPLE 8

First, respective powder raw materials of $SrCO_3$, $La_2O_3$, $Bi_2O_3$, $TiO_2$, $MnCO_3$, and $Er_2O_3$ were prepared as starting substances and weighed so that a final composition of a main component should be $(Sr_{0.9}La_{0.1})Bi_4Ti_4O_{15}$ and the content of $MnCO_3$ being a secondary component should be 0.06 wt % in terms of MnO, and were then subjected to ball mill mixing (about 16 hours) in pure water by the use of zirconia balls.

Thereafter, the obtained mixture was used to obtain piezoelectric ceramics (Sample 8-1 to Sample 8-6) like in Example 1. However, $Er_2O_3$ was weighed and added to calcined things so that the contents thereof should be as shown in Table 8 below. On both surfaces of each of the piezoelectric ceramics, Ag electrodes (diameter 1.5 mm, thickness 1 μm) for evaluating thickness longitudinal vibration were formed by the vacuum deposition method.

With respect to each of the piezoelectric ceramics thus produced, Qmax was measured under the same condition as in Example 1, and a result thereof was shown in Table 8 below.

TABLE 8

| Piezoelectric Ceramics | Er Content (wt %) | Qmax (16 MHz) |
|---|---|---|
| *Sample 8-1 | 0 | 11.8 |
| Sample 8-2 | 0.02 | 12.2 |
| Sample 8-3 | 0.05 | 12.3 |
| Sample 8-4 | 0.10 | 12.1 |
| Sample 8-5 | 0.12 | 12.0 |
| *Sample 8-6 | 0.14 | 10.0 |

Sample with * mark deviates from the present invention.

As shown in Table 8, it was confirmed that the piezoelectric ceramics (Sample 8-2 to Sample 8-5) containing $(Sr_{0.9}La_{0.1})Bi_4Ti_4O_{15}$ being the main component, and Mn oxide and Er oxide as the secondary components, and further, containing the Er oxide in a range of 0.02 to 0.12 wt % in terms of $Er_2O_3$, all had Qmax of 12 or more. Further, Curie points of these piezoelectric ceramics were measured like in Example 1 and consequently were all 510° C. or higher.

EXAMPLE 9

First, respective powder raw materials of $SrCO_3$, $BaCO_3$, $La_2O_3$, $Bi_2O_3$, $TiO_2$, $MnCO_3$, and $Pr_2O_3$ were prepared as starting substances and weighed so that a final composition of a main component should be $(Sr_{0.8}Ba_{0.1}La_{0.1})Bi_4Ti_4O_{15}$ and the content of $MnCO_3$ being a secondary component should be 0.3 wt % in terms of MnO, and were then subjected to ball mill mixing (about 16 hours) in pure water by the use of zirconia balls.

Thereafter, the obtained mixture was used to obtain piezoelectric ceramics (Sample 9-1 to Sample 9-6) like in Example 1. However, $Pr_2O_3$ was weighed and added to calcined things so that the contents thereof should be as shown in Table 9 below. On both surfaces of each of the piezoelectric ceramics, Ag electrodes (diameter 1.5 mm, thickness 1 μm) for evaluating thickness longitudinal vibration were formed by the vacuum deposition method.

With respect to each of the piezoelectric ceramics thus produced, Qmax was measured under the same condition as in Example 1, and a result thereof was shown in Table 9 below.

TABLE 9

| Piezoelectric Ceramics | Pr Content (wt %) | Qmax (16 MHz) |
|---|---|---|
| *Sample 9-1 | 0 | 10.6 |
| Sample 9-2 | 0.02 | 12.1 |
| Sample 9-3 | 0.05 | 12.3 |
| Sample 9-4 | 0.10 | 12.2 |
| Sample 9-5 | 0.12 | 12.0 |
| *Sample 9-6 | 0.14 | 10.4 |

Sample with * mark deviates from the present invention.

As shown in Table 9, it was confirmed that the piezoelectric ceramics (Sample 9-2 to Sample 9-5) containing $(Sr_{0.8}Ba_{0.1}La_{0.1})Bi_4Ti_4O_{15}$ being the main component, and Mn oxide and Pr oxide as the secondary components, and further, containing the Pr oxide in a range of 0.02 to 0.12 wt % in terms of $Pr_2O_3$, all had Qmax of 12 or more. Further, Curie points of these piezoelectric ceramics were measured like in Example 1 and consequently were all 490° C. or higher.

EXAMPLE 10

First, respective powder raw materials of $SrCO_3$, $Sm_2O_3$, $Bi_2O_3$, $TiO_2$, $MnCO_3$, and $Gd_2O_3$ were prepared as starting substances and weighed so that a final composition of a main component should be $(Sr_{0.95}Sm_{0.05})Bi_4Ti_4O_{15}$ and the content of $MnCO_3$ being a secondary component should be 0.24 wt % in terms of MnO, and were then subjected to ball mill mixing (about 16 hours) in pure water by the use of zirconia balls.

Thereafter, the obtained mixture was used to obtain piezoelectric ceramics (Sample 10-1 to Sample 10-6) like in Example 1. However, $Gd_2O_3$ was weighed and added to calcined things so that the contents thereof should be as shown in Table 10 below. On both surfaces of each of the piezoelectric ceramics, Ag electrodes (diameter 1.5 mm, thickness 1 µm) for evaluating thickness longitudinal vibration were formed by the vacuum deposition method.

With respect to each of the piezoelectric ceramics thus produced, Qmax was measured under the same condition as in Example 1, and a result thereof was shown in Table 10 below.

TABLE 10

| Piezoelectric Ceramics | Gd Content (wt %) | Qmax (16 MHz) |
|---|---|---|
| *Sample 10-1 | 0 | 11.8 |
| Sample 10-2 | 0.02 | 13.1 |
| Sample 10-3 | 0.05 | 13.3 |
| Sample 10-4 | 0.10 | 13.6 |
| Sample 10-5 | 0.12 | 13.5 |
| *Sample 10-6 | 0.14 | 11.9 |

Sample with * mark deviates from the present invention.

As shown in Table 10, it was confirmed that the piezoelectric ceramics (Sample 10-2 to Sample 10-5) containing $(Sr_{0.95}Sm_{0.05})Bi_4Ti_4O_{15}$ being the main component, and Mn oxide and Gd oxide as the secondary components, and further, containing the Gd oxide in a range of 0.02 to 0.12 wt % in terms of $Gd_2O_3$, all had Qmax of 12 or more. Further, Curie points of these piezoelectric ceramics were measured like in Example 1 and consequently were all 460° C. or higher.

EXAMPLE 11

First, respective powder raw materials of $SrCO_3$, $La_2O_3$, $Bi_2O_3$, $TiO_2$, $MnCO_3$, and $Ho_2O_3$ were prepared as starting substances and weighed so that a final composition of a main component should be $(Sr_{0.6}La_{0.4})Bi_4Ti_4O_{15}$ and the content of $MnCO_3$ being a secondary component should be 0.62 wt % in terms of MnO, and were then subjected to ball mill mixing (about 16 hours) in pure water by the use of zirconia balls.

Thereafter, the obtained mixture was used to obtain piezoelectric ceramics (Sample 11-1 to Sample 11-6) like in Example 1. However, $Ho_2O_3$ was weighed and added to calcined things so that the contents thereof should be as shown in Table 11 below. On both surfaces of each of the piezoelectric ceramics, Ag electrodes (diameter 1.5 mm, thickness 1 µm) for evaluating thickness longitudinal vibration were formed by the vacuum deposition method.

With respect to each of the piezoelectric ceramics thus produced, Qmax was measured under the same condition as in Example 1, and a result thereof was shown in Table 11 below.

TABLE 11

| Piezoelectric Ceramics | Ho Content (wt %) | Qmax (16 MHz) |
|---|---|---|
| *Sample 11-1 | 0 | 11.8 |
| Sample 11-2 | 0.02 | 13.1 |
| Sample 11-3 | 0.05 | 13.5 |
| Sample 11-4 | 0.10 | 13.4 |
| Sample 11-5 | 0.12 | 12.8 |
| *Sample 11-6 | 0.14 | 10.2 |

Sample with * mark deviates from the present invention.

As shown in Table 11, it was confirmed that the piezoelectric ceramics (Sample 11-2 to Sample 11-5) containing $(Sr_{0.6}La_{0.4})Bi_4Ti_4O_{15}$ being the main component, and Mn oxide and Ho oxide as the secondary components, and further, containing the Ho oxide in a range of 0.02 to 0.12 wt % in terms of $Ho_2O_3$, all had Qmax of 12 or more. Further, Curie points of these piezoelectric ceramics were measured like in Example 1 and consequently were all 450° C or higher.

EXAMPLE 12

First, respective powder raw materials of $SrCO_3$, $Sm_2O_3$, $Bi_2O_3$, $TiO_2$, CoO, and $Er_2O_3$ were prepared as starting substances and weighed so that a final composition of a main component should be $(Sr_{0.9}Sm_{0.1})Bi_4Ti_4O_{15}$ and the content of CoO being a secondary component should be 0.3 wt %, and were then subjected to ball mill mixing (about 16 hours) in pure water by the use of zirconia balls.

Thereafter, the obtained mixture was used to obtain piezoelectric ceramics (Sample 12-1 to Sample 12-6) like in Example 1. However, $Er_2O_3$ was weighed and added to calcined things so that the contents thereof should be as shown in Table 12 below. On both surfaces of each of the piezoelectric ceramics, Ag electrodes (diameter 1.5 mm, thickness 1 µm) for evaluating thickness longitudinal vibration were formed by the vacuum deposition method.

With respect to each of the piezoelectric ceramics thus produced, Qmax was measured under the same condition as in Example 1, and a result thereof was shown in Table 12 below.

TABLE 12

| Piezoelectric Ceramics | Er Content (wt %) | Qmax (16 MHz) |
|---|---|---|
| *Sample 12-1 | 0 | 10.3 |
| Sample 12-2 | 0.02 | 12.0 |
| Sample 12-3 | 0.05 | 12.1 |
| Sample 12-4 | 0.10 | 12.1 |
| Sample 12-5 | 0.12 | 12.0 |
| *Sample 12-6 | 0.14 | 9.5 |

Sample with * mark deviates from the present invention.

As shown in Table 12, it was confirmed that the piezoelectric ceramics (Sample 12-2 to Sample 12-5) containing $(Sr_{0.9}Sm_{0.1})Bi_4Ti_4O_{15}$ being the main component, and Co oxide and Er oxide as the secondary components, and further, containing the Er oxide in a range of 0.02 to 0.12 wt % in terms of $Er_2O_3$, all had Qmax of 12 or more. Further, Curie points of these piezoelectric ceramics were measured like in Example 1 and consequently were all 460° C. or higher.

COMPARATIVE EXAMPLE1

First, respective powder raw materials of $SrCO_3$, $Bi_2O_3$, $TiO_2$, $Sc_2O_3$, and $MnCO_3$ were prepared as starting substances and weighed so that a final composition of a main component should be $(Sr_{0.9}Sc_{0.1})Bi_4Ti_4O_{15}$ and the content of $MnCO_3$ being a secondary component should be 0.3 wt % in terms of MnO, and were then subjected to ball mill mixing (about 16 hours) in pure water by the use of zirconia balls.

Thereafter, the obtained mixture was used to obtain piezoelectric ceramics (Comparative Sample 1) like in Example 1. On both surfaces of this piezoelectric ceramics, Ag electrodes (diameter 1.5 mm, thickness 1 μm) for evaluating thickness longitudinal vibration were formed by the vacuum deposition method.

With respect to the piezoelectric ceramics thus produced, Qmax was measured under the same condition as in Example 1. As a result, Qmax was 10.5 and did not satisfy the required characteristic of the resonator at 16 MHz.

COMPARATIVE EXAMPLE 2

First, respective powder raw materials of $SrCO_3$, $Bi_2O_3$, $TiO_2$, $Y_2O_3$, and $MnCO_3$ were prepared as starting substances and weighed so that a final composition of a main component should be $(Sr_{0.9}Y_{0.1})Bi_4Ti_4O_{15}$ and the content of $MnCO_3$ being a secondary component should be 0.3 wt % in terms of MnO, and were then subjected to ball mill mixing (about 16 hours) in pure water by the use of zirconia balls.

Thereafter, the obtained mixture was used to obtain piezoelectric ceramics (Comparative Sample 2) like in Example 1. On both surfaces of this piezoelectric ceramics, Ag electrodes (diameter 1.5 mm, thickness 1 μm) for evaluating thickness longitudinal vibration were formed by the vacuum deposition method.

With respect to the piezoelectric ceramics thus produced, Qmax was measured under the same condition as in Example 1. As a result, Qmax was 11.5 and did not satisfy the required characteristic of the resonator at 16 MHz.

COMPARATIVE EXAMPLE 3

First, respective powder raw materials of $SrCO_3$, $Bi_2O_3$, $TiO_2$, $La_2O_3$, and $MnCO_3$ were prepared as starting substances and weighed so that a final composition of a main component should be $(Sr_{0.9}La_{0.1})Bi_4Ti_4O_{15}$ and the content of $MnCO_3$ being a secondary component should be 0.18 wt % in terms of MnO, and were then subjected to ball mill mixing (about 16 hours) in pure water by the use of zirconia balls.

Thereafter, the obtained mixture was used to obtain piezoelectric ceramics (Comparative Sample 3) like in Example 1. On both surfaces of this piezoelectric ceramics, Ag electrodes (diameter 1.5 mm, thickness 1 μm) for evaluating thickness longitudinal vibration were formed by the vacuum deposition method.

With respect to the piezoelectric ceramics thus produced, Qmax was measured under the same condition as in Example 1. As a result, Qmax was 11.8 and did not satisfy the required characteristic of the resonator at 16 MHz.

EXAMPLE 13

First, respective powder raw materials of $CaCO_3$, $La_2O_3$, $Bi_2O_3$, $TiO_2$, $MnCO_3$, and $Pr_2O_3$ were prepared as starting substances and weighed so that a final composition of a main component should be $(Ca_{0.97}La_{0.03})Bi_4Ti_4O_{15}$ and the content of $MnCO_3$ being a secondary component should be 0.3 wt % in terms of MnO, and were then subjected to ball mill mixing (about 16 hours) in pure water by the use of zirconia balls.

Thereafter, like in Example 1, the obtained mixture was used to obtain piezoelectric ceramics (Sample 13-1 to Sample 13-6) each having a length of 2 mm, a width of 1.25 mm, and a thickness of 435 μm. However, $Pr_2O_3$ was weighed and added to calcined things so that the contents thereof should be as shown in Table 13 below. On both surfaces of each of the piezoelectric ceramics, Ag electrodes (diameter 1.5 mm, thickness 1 μm) for evaluating thickness longitudinal vibration were formed by the vacuum deposition method.

With respect to each of the piezoelectric ceramics thus produced, Qmax was measured under the following condition and a result thereof was shown in Table 13 below.

Measurement Condition of Qmax

By the use of an impedance analyzer HP4194A produced by Hewlett-Packard Development Company, L.P., the impedance characteristic was measured in a three-order harmonic mode of thickness longitudinal vibration (60 MHz) to derive Qmax. Qmax contributes to low-voltage oscillation as a resonator and Qmax at 60 MHz is required to be 6 or more.

TABLE 13

| Piezoelectric Ceramics | Pr Content (wt %) | Qmax (60 MHz) |
| --- | --- | --- |
| *Sample 13-1 | 0 | 5.9 |
| Sample 13-2 | 0.02 | 6.5 |
| Sample 13-3 | 0.05 | 6.7 |
| Sample 13-4 | 0.10 | 6.5 |
| Sample 13-5 | 0.12 | 6.1 |
| *Sample 13-6 | 0.14 | 5.4 |

Sample with * mark deviates from the present invention.

As shown in Table 13, it was confirmed that the piezoelectric ceramics (Sample 13-2 to Sample 13-5) containing $(Ca_{0.97}La_{0.03})Bi_4Ti_4O_{15}$ being the main component, and Mn oxide and Pr oxide as the secondary components, and further, containing the Pr oxide in a range of 0.02 to 0.12 wt % in terms of $Pr_2O_3$, all had Qmax of 6 or more. Further, Curie points of these piezoelectric ceramics were measured like in Example 1 and consequently were all 750° C. or higher.

EXAMPLE 14

First, respective powder raw materials of $CaCO_3$, $La_2O_3$, $Bi_2O_3$, $TiO_2$, $MnCO_3$, and $Ho_2O_3$ were prepared as starting substances and weighed so that a final composition of a main component should be $(Ca_{0.97}La_{0.03})Bi_4Ti_4O_{15}$ and the content of $MnCO_3$ being a secondary component should be 0.18 wt % in terms of MnO, and were then subjected to ball mill mixing (about 16 hours) in pure water by the use of zirconia balls.

Thereafter, like in Example 1, the obtained mixture was used to obtain piezoelectric ceramics (Sample 14-1 to Sample 14-6) each having a length of 2 mm, a width of 1.25 mm, and a thickness of 435 μm. However, $Ho_2O_3$ was weighed and added to calcined things so that the contents thereof should be as shown in Table 14 below. On both surfaces of each of the piezoelectric ceramics, Ag electrodes (diameter 1.5 mm, thickness 1 μm) for evaluating thickness longitudinal vibration were formed by the vacuum deposition method.

With respect to each of the piezoelectric ceramics thus produced, Qmax was measured under the same condition as in Example 13, and a result thereof was shown in Table 14 below.

TABLE 14

| Piezoelectric Ceramics | Ho Content (wt %) | Qmax (60 MHz) |
|---|---|---|
| *Sample 14-1 | 0 | 5.9 |
| Sample 14-2 | 0.02 | 6.3 |
| Sample 14-3 | 0.05 | 6.6 |
| Sample 14-4 | 0.10 | 6.3 |
| Sample 14-5 | 0.12 | 6.1 |
| *Sample 14-6 | 0.14 | 4.9 |

Sample with * mark deviates from the present invention.

As shown in Table 14, it was confirmed that the piezoelectric ceramics (Sample 14-2 to Sample 14-5) containing $(Ca_{0.97}La_{0.03})Bi_4Ti_4O_{15}$ being the main component, and Mn oxide and Ho oxide as the secondary components, and further, containing the Ho oxide in a range of 0.02 to 0.12 wt % in terms of $Ho_2O_3$, all had Qmax of 6 or more. Further, Curie points of these piezoelectric ceramics were measured like in Example 1 and consequently were all 750° C. or higher.

COMPARATIVE EXAMPLE 4

Piezoelectric ceramics (Comparative Sample 4) was obtained like in the foregoing Comparative Example 3. On both surfaces of this piezoelectric ceramics, Ag electrodes (diameter 1.5 mm, thickness 1 μm) for evaluating thickness longitudinal vibration were formed by the vacuum deposition method.

With respect to the piezoelectric ceramics thus produced, Qmax was measured under the same condition as in Example 13. As a result, Qmax was 2.0 and did not satisfy the required characteristic of the resonator at 60 MHz.

COMPARATIVE EXAMPLE 5

First, respective powder raw materials of $SrCO_3$, $CaCO_3$, $Bi_2O_3$, $TiO_2$, $La_2O_3$, and $MnCO_3$ were prepared as starting substances and weighed so that a final composition of a main component should be $(Sr_{0.33}Ca_{0.67})_{0.9}La_{0.1}Bi_4Ti_4O_{15}$ and the content of $MnCO_3$ being a secondary component should be 0.18 wt % in terms of MnO, and were then subjected to ball mill mixing (about 16 hours) in pure water by the use of zirconia balls.

Thereafter, the obtained mixture was used to obtain piezoelectric ceramics (Comparative Sample 5) like in Example 1. On both surfaces of this piezoelectric ceramics, Ag electrodes (diameter 1.5 mm, thickness 1 μm) for evaluating thickness longitudinal vibration were formed by the vacuum deposition method.

With respect to the piezoelectric ceramics thus produced, Qmax was measured under the same condition as in Example 13. As a result, Qmax was 5.7 and did not satisfy the required characteristic of the resonator at 60 MHz.

INDUSTRIAL APPLICABILITY

Applicable to electronic devices such as resonators and filters and to products and the like such as sensors and actuators that use electric charge and displacement.

The invention claimed is:

1. A piezoelectric ceramic comprising:
   a bismuth layer-structured compound comprising $(M^{II}_{1-x}Ln_x)Bi_4Ti_4O_{15}$ crystals, as a main component, wherein $M^{II}$ is an element selected from Sr, Ba, and Ca; Ln is an element selected from lanthanoids; and x is within a range of $0<x\leq0.5$; and
   a lanthanoid and at least one of Mn oxide and Co oxide, as secondary components wherein the secondary component lanthanoid is present in an amount of 0.02 to 0.12 wt % in terms of oxide thereof.

2. The piezoelectric ceramic according to claim 1, wherein the Mn oxide or Co oxide is present in an amount of 0.02 to 0.62 wt % in terms of MnO or CoO respectively.

3. The piezoelectric ceramic according to claim 1, wherein the main component Ln is a lanthanoid selected from the group consisting of La, Pr, Sm, Gd, Dy, and Ho.

4. The piezoelectric ceramic according to claim 1, wherein the secondary component lanthanoid is selected from the group consisting of Pr, Nd, Sm, Gd, Dy, and Ho.

5. The piezoelectric ceramic according to claim 1, wherein x is within a range of $0.01\leq x\leq0.2$.

6. The piezoelectric ceramic according to claim 1, wherein the secondary component lanthanoid is present in an amount of 0.05 to 0.1 wt % in terms of oxide thereof.

7. The piezoelectric ceramic according to claim 1, wherein the Mn oxide or Co oxide is present in an amount of 0.03 to 0.43 wt % in terms of MnO or CoO respectively.

8. The piezoelectric ceramic according to claim 1, wherein the main component Ln is a lanthanoid selected from the group consisting of La, Ce, Pr, Nd, Pm, Sm, Eu, Gd, Tb, Dy, Ho, Er, Tm, Yb or Lu.

9. The piezoelectric ceramic according to claim 1, wherein the secondary component lanthanoid is selected from the group consisting of La, Ce, Pr, Nd, Pm, Sm, Eu, Gd, Tb, Dy, Ho, Er, Tm, Yb or Lu.

* * * * *